(12) United States Patent
Bera et al.

(10) Patent No.: US 9,972,709 B2
(45) Date of Patent: May 15, 2018

(54) SEMICONDUCTOR DEVICE FABRICATION

(71) Applicant: Agency for Science, Technology and Research, Singapore (SG)

(72) Inventors: Lakshmi Kanta Bera, Singapore (SG); Surani Bin Dolmanan, Singapore (SG); Manippady Krishna Kumar, Singapore (SG); Rasanayagam Sivasayan Kajen, Singapore (SG); Sudhiranjan Tripathy, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days. days.

(21) Appl. No.: 15/479,022

(22) Filed: Apr. 4, 2017

(65) Prior Publication Data
US 2017/0222030 A1 Aug. 3, 2017

Related U.S. Application Data

(62) Division of application No. 15/029,835, filed as application No. PCT/SG2014/000495 on Oct. 20, 2014.

(30) Foreign Application Priority Data

Oct. 18, 2013 (SG) .............................. 201307786-2

(51) Int. Cl.
*H01L 29/15* (2006.01)
*H01L 29/778* (2006.01)
(Continued)

(52) U.S. Cl.
CPC ...... *H01L 29/7783* (2013.01); *H01L 21/0254* (2013.01); *H01L 21/283* (2013.01);
(Continued)

(58) Field of Classification Search
CPC ........... H01L 21/02458; H01L 21/0251; H01L 21/0254; H01L 21/0262; H01L 29/454;
(Continued)

(56) References Cited

U.S. PATENT DOCUMENTS 6,048,756 A 4/2000 Lee et al.
8,169,005 B2 5/2012 Wu et al.
(Continued)

OTHER PUBLICATIONS

International Search Report for PCT/SG2014/000495, 5 pages (dated Jan. 27, 2015).
(Continued)

*Primary Examiner* — Brook Kebede
(74) *Attorney, Agent, or Firm* — Choate, Hall & Stewart LLP

(57) ABSTRACT

There is provided a method for fabricating a semiconductor device having the following structure, and comprising the steps of growing a first and a second nucleation layer on a substrate; depositing a binary layer over these nucleation layers; and annealing the binary layer to form a first contact area and a second contact area on the substrate, wherein the annealed binary layer comprises a group 14 element selected from Si, Ge and their combination thereof, and the annealed binary layer in the first and second contact areas are capable of providing a lower contact resistance for a current to flow in the device. This method serves to provide an intermediate layer which enables the fabrication process to become CMOS compatible.

10 Claims, 7 Drawing Sheets

(51) Int. Cl.
| | |
|---|---|
| *H01L 29/66* | (2006.01) |
| *H01L 29/78* | (2006.01) |
| *H01L 29/20* | (2006.01) |
| *H01L 29/45* | (2006.01) |
| *H01L 21/283* | (2006.01) |
| *H01L 21/308* | (2006.01) |
| *H01L 21/311* | (2006.01) |
| *H01L 21/324* | (2006.01) |
| *H01L 21/02* | (2006.01) |
| *H01L 29/417* | (2006.01) |

(52) U.S. Cl.
CPC .... *H01L 21/3085* (2013.01); *H01L 21/31133* (2013.01); *H01L 21/324* (2013.01); *H01L 29/2003* (2013.01); *H01L 29/452* (2013.01); *H01L 29/66462* (2013.01); *H01L 29/66522* (2013.01); *H01L 29/66553* (2013.01); *H01L 29/7786* (2013.01); *H01L 29/78* (2013.01); *H01L 21/02458* (2013.01); *H01L 21/02502* (2013.01); *H01L 29/41766* (2013.01)

(58) Field of Classification Search
CPC ......... H01L 29/66462; H01L 29/66522; H01L 29/7783; H01L 29/7786
USPC .................................. 257/76, 192, 194, 195
See application file for complete search history.

(56) References Cited

U.S. PATENT DOCUMENTS

| | | | |
|---|---|---|---|
| 2004/0115888 | A1 | 6/2004 | Chang |
| 2005/0274980 | A1* | 12/2005 | Miyoshi ............. H01L 29/7787 257/192 |
| 2009/0045438 | A1* | 2/2009 | Inoue ................... H01L 29/155 257/192 |
| 2010/0117186 | A1 | 5/2010 | Kambayashi et al. |
| 2010/0252862 | A1 | 10/2010 | Ko et al. |
| 2011/0057270 | A1 | 3/2011 | Nishikawa |
| 2011/0140173 | A1 | 6/2011 | Ramdani |
| 2013/0149830 | A1 | 6/2013 | Rhee et al. |
| 2014/0191240 | A1* | 7/2014 | Chiang ............... H01L 29/7783 257/76 |
| 2016/0233325 | A1 | 8/2016 | Bera et al. |

OTHER PUBLICATIONS

Written Opinion for PCT/SG2014/000495, 7 pages (dated Jan. 27, 2015).

* cited by examiner

SEMICONDUCTOR DEVICE FABRICATION

CROSS-REFERENCE TO RELATED APPLICATIONS

This patent application is a divisional application of U.S. patent application Ser. No. 15/029,835, entitled "SEMICONDUCTOR DEVICE FABRICATION", filed on Apr. 15, 2016, which is a National Stage Entry of International Patent Application No. PCT/SG2014/000495, filed on Oct. 20, 2014, which claims priority to SG 201307786-2, filed on Oct. 18, 2013, the entire contents of each of which are hereby incorporated by reference herein.

TECHNICAL FIELD

The present invention relates to a method for fabricating a semiconductor device. The present invention also relates to a semiconductor structure.

BACKGROUND

Transistor development have accelerated significantly in recent years particularly after the launching of "GaNpowIR" by "International Rectifier" and "eGaN FET" devices by "Efficient Power Conversion (EPC)" in 2010. These devices are particularly developed so as to cater for the low voltage market. These entities have developed highly efficient GaN high power transistor with breakdown voltages of about 600 V. More recently, Transphorm USA has also developed a 600 V semiconductor device using gallium-nitride (GaN) on silicon (Si).

Research efforts on the above devices have been spurred by the lower cost of using GaN on larger silicon substrates. As the silicon substrate plays an important role for GaN growth, ongoing research efforts have been focus on further reducing the cost of silicon compatible processes for making such devices. From an application point of view, silicon compatible processes developed based on these research efforts are not limited to low voltage applications, but may include high voltage applications, radio frequency (RF), wireless and light emitting diode applications. One such example relates to the research on p-type high electron mobility transistors (HEMT) which may lead to new generation of extraordinary high speed devices for various applications. In this context, there is a need for developing complementary metal oxide semiconductor (CMOS) process technology which may be compatible and applicable for fabrication of GaN based devices such as HEMT. However, several issues remain outstanding.

Accordingly, CMOS compatible metal remains poor or unsuitable contacts for GaN/AlGaN (aluminum-gallium-nitride) system when compared to gold-based (Au-based) processes. Yet, processes that utilize gold tend not to be cost-effective due to the use of gold material itself.

It is also known that CMOS compatible metal causes high ohmic resistance at source and drain (S/D) and this adversely affects devices performances.

Moreover, salicidation/germanidation of Si, Ge or SiGe materials may not be directly applied on GaN/AlGaN layers unlike typical Si-technology as self-aligning CMOS compatible processes remain unavailable due to the nature of GaN/AlGaN/metal systems which do not undergo silicidation/germanidation easily. Conventional self-aligned silicidation process requires metal deposition after a gate and spacer formation. This metal layer deposition is typically a blanket deposition. In such a process, the gate source and drain may be electrically shorted which is undesirable. After metal deposition, an annealing step may usually be required for the formation of a fused layer which tends to comprise a metal alloy. In the instance where GaN/AlGaN material is directly fused with a CMOS compatible metal, the fused metal layer tends to form only an ultrathin Ga(Al)GaN metal alloy layer at the interface. However, such an ultrathin Ga(Al)GaN metal alloy layer may be susceptible to removal by subsequent etching steps since most etchants tend to be able to remove the GaN thin alloyed layer. Thus, the direct alloying of metal in conventional self-aligning process, when combined with subsequent etching to remove any unreacted/non-fused metal, is not applicable for GaN/AlGaN based systems. In order to perform CMOS compatible processes with suitable isolation schemes, there is a need to develop a new device processing sequence.

Accordingly, there is a need to provide a method for fabricating semiconductor devices which overcomes, or at least ameliorates, one or more of the disadvantages described above.

To overcome the abovementioned issues, there is a need to develop an Au-free CMOS compatible self-aligning method for fabricating transistors (e.g. MOSFETs) using AlGaN/GaN HEMT based systems grown on bulk Si or silicon on insulator (SOI) substrates. Such a method may also be applicable to GaN-based HEMT structure on sapphire substrates or silicon carbide (SiC) substrate.

Particularly, there is a need to develop an intermediate platform or layer to enhance the compatibility of CMOS process technology on HEMT devices while using selected metal layering that could improve contact/ohmic resistance.

SUMMARY

In one aspect, there is provided a method for fabricating a semiconductor device comprising the steps of:

growing a first and a second nucleation layer on a substrate;

depositing a binary layer over the first and second nucleation layers; and annealing the binary layer to form a first contact area and a second contact area on the substrate, wherein the annealed binary layer comprises a group 14 element selected from Si, Ge and their combination thereof, and the annealed binary layer in the first and second contact areas are capable of providing a lower contact resistance for a current to flow in the device.

Advantageously, this method provides a way for integrating CMOS compatible process on GaN/AlGaN HEMT structure. This method is also self-aligning in the sense that multiple photo-resist steps may be circumvented or minimized in order to build the various structures such as the S/D features, the gate electrode etc. This fabrication method also advantageously provides processing capability of devices with symmetric high energy electron mobility transistor (HEMT). This method is capable of reducing the contact resistance to at least match or overcome the performance of devices produced using Au-based contact technologies.

Advantageously, the deposition of at least one nucleation layer on the substrate allows the quality of a deposited GaN epitaxial layer to be fine-tuned via the thickness of the nucleation layer. The thickness may be altered by growing or depositing at least one layer of aluminum nitride (AlN).

Either of the first or second contact areas may serve as the source and drain. In one instance, the first contact area may be the source while the second contact area may be the drain or vice versa.

The method may further comprise before depositing the binary layer, the steps of:

depositing a first epitaxial layer and a second epitaxial layer over the first and second nucleation layers to form a channel layer comprising portions of the first and second epitaxial layers;

depositing a third epitaxial layer on the second epitaxial layer; and wherein the binary layer is deposited over the first, second and third epitaxial layers, and wherein the annealing step comprises:

annealing the binary layer with the first, second or third epitaxial layer to form the first contact area and the second contact area on the first, second or third epitaxial layer. The first, second and third epitaxial layers deposited form the basic structure of a transistor, such as a HEMT transistor.

The method may further provide the flexibility of forming a gate electrode between the first and second contact areas before or after the annealing of the binary layer with the first, second or third epitaxial layer.

In the method defined above, the first epitaxial layer deposited may be gallium nitride (GaN), the second epitaxial layer deposited may be aluminum gallium nitride (AlGaN) and the third epitaxial layer deposited may be gallium nitride. By using GaN and AlGaN as the first and second epitaxial layers, respectively, a channel layer comprising a two-dimensional electron gas (2DEG) layer may be advantageously formed. This 2DEG layer confines the highly mobile electrons to a two dimensional movement-along the interface between the first and second epitaxial layers. This 2DEG layers may also prevent electron leakage in a third direction. Alternatively, as long as the second epitaxial layer has a wider band gap compared to the first epitaxial layer, a 2DEG layer may be formed. This 2DEG layer also allows electrons to move from source to drain more quickly as they face fewer obstacles which may be due to impurities caused by conventional implant or doping steps at the source and drain.

The method may include isolating the device via shallow trench isolation, mesa isolation or deposition of field oxides.

In a gate first process, the method may comprise depositing a dielectric layer on the third epitaxial layer before annealing the binary layer with the first epitaxial layer. Subsequently, a CMOS compatible metal layer may be deposited on the dielectric layer. A photo-resist layer may be patterned on the CMOS compatible metal layer, followed by etching of the photo-resist layer to form a CMOS compatible metal gate structure. There may be a subsequent stripping strip to remove any residual photo-resist after etching in order to prevent embedded defects from forming when subsequent processing steps are involved.

When forming the gate first, a thin spacer layer may be formed via deposition and etching of the thin spacer layer to lead to the formation of the thin spacer on both sides of the compatible metal gate structure. A thin spacer may be formed via deposition and etching of the thin spacer to lead to the formation of the thin spacer located between the binary layer and, the third epitaxial layer. There may also be an over-etching step to remove a. portion of the dielectric layer. This may also include partial removal of the second and third epitaxial layers to expose the channel layer and to form a gate structure from the dielectric layer, the second and third epitaxial layers.

A layer, having a group 14 element selected from Si, Ge and their combination thereof may then be deposited at 400° C. to 850° C. to cover the gate structure formed from the compatible metal layer, the dielectric layer, the second and third epitaxial layers. More particularly, the deposition of this metal layer comprising Si, Ge or their combination thereof may be at 400° C. to 800° C.

Advantageously, this metal layer may serve as the intermediate platform or layer for enhancing the compatibility of CMOS process technology on HEMT devices so as to improve contact/ohmic resistance, particularly at the S/D.

A thick spacer layer may then be deposited and etched the thick spacer layer to form a thick spacer on both sides of the gate structure formed from the compatible metal layer, the dielectric layer, the second and third epitaxial layers for forming the gate electrode.

Both the thin and thick spacers may comprise any suitable insulating materials that are inert with the metal during silicidation/germanidation. Advantageously, these spacers isolate the gate from the S/D so as to prevent electrical short circuits between the gate and S/D.

As defined in the method for a gate first process, a CMOS compatible metal selected from the group of Ta, TaN, Ti, TiN, Ni, Co, Al, W, WN, any non-gold based metal and their combination thereof, may be deposited on the metal layer having a group 14 element selected from Si, Ge and their combination thereof, to form the binary layer, and the binary layer may, be annealed with the first epitaxial layer to form the first and second contact areas with the gate electrode disposed between the first and second contact areas on the first epitaxial layer.

The method may also be used for a gate last process which comprises the steps of patterning a photo-resist on the third epitaxial layer and etching the photo-resist, the first, second and third epitaxial layers to form an island. The photo-resist may be stripped and a silicon nitride ($Si_3N_4$), silicon oxide ($SiO_2$), silicon-oxynitride (SiON) or $Al_2O_3$ layer which is capable of acting as a field insulator layer surrounding the island may be deposited.

It is also possible that the photo-resist may then be stripped and a silicon nitride passivation/field insulator layer may be deposited to achieve device isolation. This device isolation scheme may be similar to shallow trench isolation. In this scheme the mesa isolation is achieved by photolithography and dry etching. After etching, a cleaning process is needed to remove residue. A SiN layer may be deposited and subsequently etched to form the active island for HEMT fabrication.

Subsequently, a gate insulating layer selected from $Al_2O_3$, $HfO_2$, $ZrO_2$, $TiO_2$, $Ta_2O_5$, Ta-doped $Al_2O_3$, HfAlO, $La_2O_3$, $Si_3N_4$, SiON, $Y_2O_3$, $HfSiO_4$, $SrTiO_2$, $LaAlO_3$ and $SiO_2$ may be deposited. The method may further comprise the steps of patterning a photo-resist and etching the gate insulator layer without leading to any recesses, or further partially etching the second and/or third epitaxial layer on the island to form at least two recesses for the first and second contact on the island. Alternatively, this method may further comprise the steps of patterning a photo resist and etching the photo-resist, the gate insulator layer, the third and second epitaxial layers of the island to form at least two troughs/recesses for the first and second contact on the island.

The term "trough" or "recess" may be used interchangeably. One of these two troughs/recesses may be the source while another trough/recess may be the complementing drain.

For the gate last process, the method may further comprise the step of depositing a metal layer having a group 14 element selected from Si, Ge and their combination thereof, at a temperature in the range of 273 K to about 350 K, at about 300 K or room temperature, to cover at the source/drain on the island. This method may also be used to cover the at least two recesses or the second and/or third epitaxial layer that may be exposed after etching the gate insulator layer on the island. Advantageously, this metal layer may serve as the intermediate platform or layer for enhancing the compatibility of CMOS process technology on HEMT devices so as to improve contact/ohmic resistance, particularly at the S/D.

A CMOS compatible metal selected from the group of Ta, TaN, Ti, TiN, Ni, Co, Al, W, WN, any non-gold based metal and their combination thereof, may then be deposited on the metal layer having a group 14 element selected from Si, Ge and their combination thereof, to form the binary layer in the at least two troughs, and the gate electrode may be formed on the island between the first and second contact areas after the binary layer in the at least two troughs is annealed with the second epitaxial layer to form the first and second contact areas. The CMOS compatible metal may also be deposited on the metal layer to form the binary layer over the exposed second and/or third epitaxial layer while the gate electrode is formed on the island between the first and second contact areas after the binary layer is annealed with the second and/or third epitaxial layer to form the first and second contact areas.

In the present method, the annealing of the binary layer with the first, second or third epitaxial layer to form the first and second contact areas may occur at 400° C. to 800° C. The annealing may involve any of the first, second or third epitaxial layer.

In another aspect, there is provided a semiconductor device having a structure comprising:

a first and a second nucleation layer disposed on a substrate;

a binary layer comprising a group 14 element selected from Si, Ge and their combination thereof disposed over the first and second nucleation layers; and a first contact area and a second contact area disposed over the substrate, wherein the first and second contacts areas formed from annealing the binary layer with the first, second or third epitaxial layer are capable of providing a lower contact resistance for a current to flow in the device.

The first and second nucleation layers may comprise a first aluminum nitride nucleation layer followed by a second thicker aluminum nitride nucleation layer. A gallium nitride layer may be disposed over the first and second nucleation layers followed by an ultrathin spacer AlN layer, an AlGaN barrier layer, and a thin binary GaN cap layer.

Advantageously, this structure provides a way for integrating CMOS compatible process on GaN/AlGaN HEMT structure. This structure may be produced via a self-aligning method in the sense that multiple photo-resist steps may be circumvented or minimized in order to build the various structures such as the S/D features, the gate electrode etc. This structure is capable of allowing the contact resistance to be reduced to at least match or overcome the performance of devices produced using Au-based contact technologies.

Advantageously, the structure comprises of a thicker aluminium nitride (AlN) layer grown over the first and second nucleation layers on the substrate which allows the quality of a, deposited GaN epitaxial layer to be fine-tuned via the thickness of both the first and the second AlN layers. The thickness may be altered by growing or depositing at least one layer of aluminum nitride (AlN). Hence, at least one AlN layer may be deposited. Each of this at least one AlN layer may be deposited at different temperatures or pressures. The surface temperature during the growth of the first AlN nucleation layer may be in the range of about 950° C. to about 1000° C. The pressure during the growth of the first AlN nucleation layer may be in the range of about 50 torr to about 100 torr. The surface temperature during the growth of the second AlN nucleation layer may be in, the range of about 1050° C. to about 1100° C. The pressure during the growth of the second AlN nucleation layer may be in the range of about 50 torr to about 75 torr. As mentioned above, either of the first or second contact areas may serve as the source and drain. In one instance, the first contact area may be the source while the second contact area may be the drain or vice versa.

The structure may further comprise, before the binary layer is deposited, a structure having:

a first epitaxial layer and a second epitaxial layer disposed over the first and second nucleation layers to form a channel layer comprising portions of the first and second epitaxial layers;

a third epitaxial layer disposed on the second epitaxial layer; and wherein the binary layer is disposed over the first, second and third epitaxial layers, and wherein the first and second contact areas formed from annealing the binary layer with the first, second or third epitaxial layer, are disposed on the first or third epitaxial layer or partially embedded in the second and/or third epitaxial layer.

The structure allows a gate electrode to be flexibly disposed between the first and second contact areas before or after the annealing of the binary layer with the first, second or third epitaxial layer. The annealing may also involve any of the epitaxial layer.

The first and second nucleation layers may comprise of aluminum nitride, and each of the first and second nucleation layer may have a thickness of 0.5 nm to 3.0 nm. The nucleation layer in the present structure may also be built over the first GaN epitaxial layer. Such a nucleation layer on a GaN buffer layer may be an aluminum nitride layer with a thickness of about 25 nm to about 30 nm on GaN buffer. The second aluminum nitride nucleation layer grown over the first nucleation layer on the substrate may have a thickness of 200 nm to 400 nm.

The first epitaxial layer may be a GaN layer with a thickness of 1.5 um to 3.0 um, or substantially 2.5 um.

The second epitaxial layer may be an AlGaN layer with a thickness of 15 nm to 25 nm, or substantially 20 nm. The second epitaxial layer may have an aluminum content of 20 to 25 wt %, or 22 to 23 wt %.

The third epitaxial layer may be a GaN layer possibly having a thickness of 1.5 nm to 3.5 nm, or 2.0 nm to 3.0 nm.

By incorporating GaN and AlGaN as the first and second epitaxial layers in the present structure, respectively, a channel layer comprising a two-dimensional electron gas (2DEG) layer may be advantageously formed. This two dimensional electron gas heterostructure layer may also be treated as comprising the first epitaxial gallium buffer layer, an ultrathin aluminum nitride spacer layer, the second epitaxial AlGaN barrier layer, and a top third epitaxial gallium nitride cap layer. This 2DEG layer confines the highly mobile electrons to a two dimensional movement along the interface (heterojunction) between the first and second epitaxial layers. This 2DEG layers may also prevent electron leakage in a third direction. Alternatively, as long as the second epitaxial layer has a wider band gap compared to the first epitaxial layer, a 2DEG layer may be formed. This 2DEG layer also allows electrons to move from source to drain more quickly as they face less obstacles which may be due to impurities caused by conventional implant or doping steps at the source and drain.

The present structure may further comprise shallow isolated trenches, mesa isolated trenches or deposited oxide layers.

For a gate first structure, the present semiconductor may have a gate electrode with a structure comprising the second epitaxial layer, the third epitaxial layer, a dieletric layer comprising aluminum oxide ($Al_2O_3$), hafnium oxide, or their combination thereof, and a CMOS compatible metal selected from the group of Ta, TaN, Ti, TiN, Ni, Co, Al, W, WN, any non-gold based metal and their combination thereof. The gate electrode may further comprise two thin spacer structures on both sides of the gate electrode, wherein the two thin spacer structures are disposed on the dielectric layer. The gate electrode may further comprise two thick spacer structures on both sides of the gate electrode, wherein the two thick spacer structures are disposed on the first epitaxial layer. The two thin and two thick spacers may be made up of aluminum nitride, aluminum oxide, silicon nitride, silicon dioxide, silicon oxynitride or their combination thereof. The two thick spacers may have a width of 50 nm to 10 um, 50 nm to 150 nm, or 100 nm to 200 nm. The width of the two thick spacers may also be substantially 10 um.

As for the gate first structure, the first and the second contact areas may be incorporated or formed from annealing the first epitaxial layer, the binary layer comprising a group 14 element selected from Si, Ge and their combination thereof, and a CMOS compatible metal selected from the group of Ta, TaN, Ti, TiN, Ni, Co, Al, W, WN, any non-gold based metal and their combination thereof.

Regarding a gate last structure, the semiconductor device may have a gate electrode comprising a single CMOS compatible metal selected from the group of Ta, TaN, Ti, TiN, Ni, Co, Al, W, WN, any non-gold based metal and their combination thereof, when the first and second contact areas are disposed on the third epitaxial layer or partially embedded in the second and/or third epitaxial layers.

The gate last structure may further comprise a field insulator layer disposed on the island formed from the first, second and third epitaxial layers in which the first and second contact areas are disposed over the third epitaxial layer or partially embedded in the second and/or third epitaxial layers, and a gate insulating layer disposed on the field insulator layer. The field insulator layer may be a silicon nitride, silicon oxide, silicon-oxynitride (SiON) or $Al_2O_3$ layer, and the gate insulating layer may be a gate dielectric layer selected from $Al_2O_3$, $HfO_2$, $ZrO_2$, $TiO_2$, $Ta_2O_5$, Ta-doped $Al_2O_3$, HfAlO, $La_2O_3$, $Si_3N_4$, SiON, $Y_2O_3$, $HfSiO_4$, $SrTiO_2$, $LaAlO_3$, $SiO_2$ and their combination thereof.

In the gate last structure, the first and second contact areas, which may be disposed over the third epitaxial layer or partially embedded in the second and/or third epitaxial layer, may be made up of an annealed layer comprising the second and/or third epitaxial layer, and the binary layer comprising a group 14 element selected from Si, Ge and their combination thereof, and a CMOS compatible metal selected from the group of Ta, TaN, Ti, TiN, Ni, Co, Al, W, WN, any non-gold based metal and their combination thereof.

In the present gate first and gate last structure, the height of the gate electrode may be 100 nm to 300 nm, or 150 nm to 250 nm.

In the present method and semiconductor structure, the substrate may be a sapphire substrate, a silicon substrate, a silicon-on-insulator substrate, or a silicon carbide substrate. The present method may be used to fabricate a semiconductor device having the present semiconductor structure. Such devices may be selected from a group consisting of field effect transistors, high electron mobility transistors, inverters, power switches, power transistor devices, radio switches and radio-frequency based devices.

In another aspect, there is provided a transistor produced by the method as defined above.

In another aspect, there is provided a transistor having the structure as defined above.

Definitions

The following words and terms used herein shall have the meaning indicated:

The term "group 14 element" may be used interchangeably with the term "group IV" element which both refer to elements in the carbon group. Group 14 or group IV elements may be selected from the group consisting of carbon (C), silicon (Si), germanium (Ge), tin (Sn) and lead (Pb).

The word "substantially" does not exclude "completely" e.g. a composition which is "substantially free" from Y may be completely free from Y. Where necessary, the word "substantially" may be omitted from the definition of the invention.

Unless specified otherwise, the terms "comprising" and "comprise", and grammatical variants thereof, are intended to represent "open" or "inclusive" language such that they include recited elements but also permit inclusion of additional, unrecited elements.

As used herein, the term "about", in the context of concentrations of components of the formulations, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc as well as individual numbers within that range, for example, 1, 2, 3, 4, 5, and 6. This applies regardless of the breadth of the range.

BRIEF DESCRIPTION OF DRAWINGS

The accompanying drawings illustrate disclosed embodiments of the present invention and serves to explain the principles of the disclosed embodiments. It is to be understood, however, that the drawings are designed for purposes of illustration only, and not as a definition of the limits of the invention.

DETAILED DISCLOSURE

Figure 1:
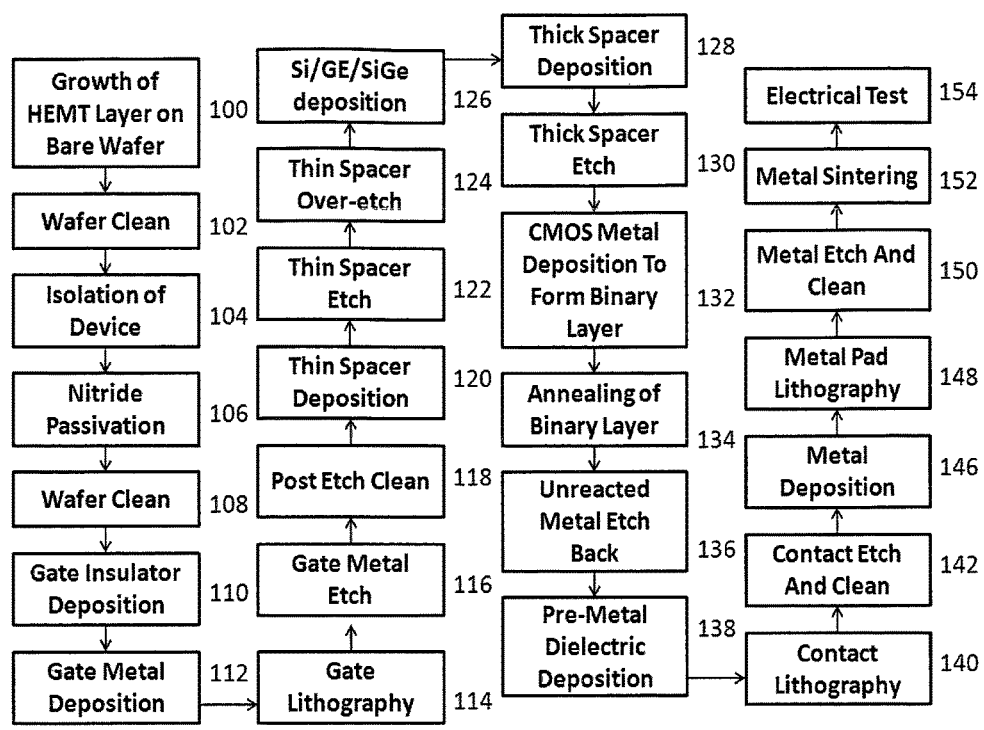
FIG. 1 shows a process flow diagram for the gate first progress based on one of the embodiments disclosed herein.

Exemplary, non-limiting embodiments of the present invention will now be disclosed.

The present disclosure is related to a method for fabricating semiconductor device, which is compatible with complimentary metal oxide semiconductor (CMOS) type processing. This method may include self align metal oxide semiconductor field effect transistors (MOSFETs) or metal oxide semiconductor high electron mobility transistors (MOSHEMTs) device fabrication using group III-nitride on silicon, silicon on insulator (SOI), sapphire or silicon carbide substrate. This method may involve a Au-free CMOS compatible self align process to fabricate MOSFETs using AlGaN/GaN HEMT grown on bulk Si and SOI substrates. The method may also be applied to GaN-based HEMT structure on sapphire substrates.

In this disclosure, there is provided a method for fabricating a semiconductor device comprising the steps of:

growing a first nucleation layer and a second nucleation layer on a substrate;

depositing a binary layer over the first and second nucleation layers;

annealing the binary layer to form a first contact area and a second contact area on the substrate, wherein the annealed binary layer comprises a group 14 element selected from Si, Ge and their combination thereof, and the annealed binary layer in the first and second contact areas are capable of providing a lower contact resistance for a current to flow in the device.

The method as defined above may further comprise, before depositing the binary layer, the steps of:

depositing a first epitaxial layer and a second epitaxial layer over the first and second nucleation layers to form a channel layer comprising portions of the first and second epitaxial layers;

depositing a third-epitaxial layer on the second epitaxial layer; and wherein the binary layer is deposited over the first, second and third epitaxial layers, and wherein the annealing step comprises:

annealing the binary layer with the first epitaxial layer, second or third epitaxial layer to form the first contact area and the second contact area on the first, second or third epitaxial layer. The annealing may also involve any of the epitaxial layers.

The method as defined above may comprise the step of depositing an ultrathin spacer layer between the first epitaxial layer and the second epitaxial layer. Advantageously, the ultrathin layer may be used for electron mobility enhancement. The presence of the ultrathin AlN spacer layer may reduce contact resistance. This is because AlN has a wider bandgap, hence its electrical conductivity is lower than AlGaN or GaN. This enables, for example, for recess etching to be performed to reduce resistance of Source/Drain metal stacks so that better contacts can be created even if the ultrathin AlN spacer layer is present. That is, the Ge or SiGe layering diffuses to the thin GaN cap/AlGaN barrier/AlN spacer and helps to reduce the contact resistance by formation of metal germanides/silicides/or germanosilicides. The ultrathin AlN spacer layer may have a thickness in the range, of about 0.5 nm to about 3.5 nm or about 1 nm to about 3.0 nm.

The first epitaxial layer may be formed from any material as long as it has a lower band gap than the second epitaxial layer that is to be deposited on the first epitaxial layer. One such material may be gallium nitride (GaN). The, second epitaxial layer may be formed from aluminum gallium nitride (AlGaN) or any other suitable material like indium aluminum nitride (InAlN) as explained above. The second epitaxial layer may also be used as a barrier layer. The third epitaxial layer may be formed from, for example but not limited to, gallium nitride (GaN). Advantageously, the third epitaxial layer may be used as a capping layer to protect the first and second epitaxial underneath it during subsequent processing. The third epitaxial layer may also be undoped GaN, undoped AlGaN or thin AlN. The materials used for forming, the first, second and third epitaxial layers may also be any materials that are capable of leading to the formation of a HEMT structure.

The first and second nucleation layer may comprise any material that is capable of enhancing the quality of the growth of any one of the epitaxial layers that are subsequently deposited over it. These nucleation layers may comprise aluminum nitride (AlN). The second nucleation layer may be deposited as an underlying layer beneath the first epitaxial layer or as an overlying layer over the any of the first, second or third epitaxial layer. These aluminum nitride layers may also enhance mobility where defect density is reduced in overgrown GaN that is deposited on such nucleation layers. The quality may increase with increasing thickness up to a certain extent. Either the first or second aluminum nitride layer may be used to improve the quality of the first epitaxial layer comprising GaN. The first nucleation layer may be formed by depositing at least one layer of AlN. This may be followed by a much thicker aluminium nitride buffer layer. Any deposition method capable of leading to the growth of at least one nucleation layer on, the substrate may be used. The ultrathinspacer layer may comprise AlN. The ultrathin spacer may have a thickness in the range of about 1.0 nm to about 3.0 nm.

Based on the above, the deposition of the binary layer may occur over the first aluminum nitride nucleation layer, the second overgrowth aluminum nitride nucleation layer, the first GaN epitaxial layer, the ultrathin AlN spacer layer, the second AlGaN epitaxial barrier layer and the third GaN epitaxial cap layer. Any of these epitaxial layers may be used to form the binary layer as well.

In the method above, a gate electrode may be formed between the first and second contact areas before or after the annealing of the binary layer with the first, second or third epitaxial layer. Either the first or second contact area may serve as the source or drain. For instance, if the first contact area serves as the source, the second contact area shall serve as the drain, or vice versa.

In the method defined above, a channel layer may be formed between the second and the first epitaxial layers. Depending on the material used, there may be a significant difference in the band gap between these two epitaxial layers. As a result, a heterostructure/heterojunction may be formed in this channel layer. This channel layer may comprise a portion of the first and second epitaxial layers. This channel layer may also exist at the interface between the first and second epitaxial layers. This channel layer may be a two-dimensional electron gas (2DEG) layer. Such a 2DEG layer imparts high mobility to the electrons in a two dimensional plane. This 2DEG advantageously prevents the electrons from flowing in a third direction i.e. towards the substrate or the wafer backside, which may happen during leakage.

The 2DEG heterostructure may also be made up of a gallium buffer layer, the first and second nucleation layer comprising aluminum nitride, a second epitaxial AlGaN layer, and a top gallium nitride layer. Notably, the second epitaxial AlGaN layer may serve as a barrier layer.

The method may further comprise the step of isolating the device. Isolation may include, but not limited to, shallow trench isolation, mesa isolation or deposition of field oxides. Before this isolation step, the water may be cleaned to prevent defects from accumulating in the under layers when the device is isolated.

Referring to FIG. 1 which depicts the process flow diagram for the method of a gate first process, the growth of HEMT layers on a bare wafer substrate 100, the cleaning of the wafer 102 before isolation of the device 104 have already been described above.

Optionally, the method for the gate first process may proceed with passivation 106 of the top HEMT layer, which may be the third epitaxial layer. After passivation, the wafer may be cleaned 108.

The method may then further comprise the step 110 of depositing a dielectric layer on the third epitaxial layer before annealing the binary layer with the first epitaxial layer. This dielectric layer may also form the gate insulator layer. This dielectric/gate insulator layer may be formed by any known deposition means. For instance, when $Al_2O_3$ used (other high-K gate dielectrics such as $hfO_2$, $ZrO_2$, $TiO_2$, $Ta_2O_5$, Ta-doped $Al_2O_3$, HfAlO, $La_2O_3$, $Si_3N_4$, SiON, $Y_2O_3$, $HfSiO_4$, $SrTiO_2$, $LaAlO_3$, $SiO_2$ or their combination thereof, etc. may also be used), atomic layer deposition (ALD) using alternating pulses of $Al(CH_3)_3$ and $H_2O$ as the precursors may be utilized. The temperature for ALD may be between, 250° C. to 350° C. or any temperature falling within this range. Depending on the application, the dielectric may also be formed using hafnium oxide ($HfO_2$) or a combination of $HfO_2$ and $Al_2O_3$. Any other deposition temperature and pressure may be used as long as the dielectric/gate insulator layer may be deposited over the HEMT layers. The choice of the gate insulator material may lead to variable electrical characteristics and threshold voltages in devices.

In the gate first process, after depositing the gate insulator 110, a gate metal layer 112 may be deposited by any suitable deposition means. This gate metal layer may be a CMOS compatible metal layer. Such a CMOS compatible metal may be selected from the group of Ta, TaN, Ti, TiN, Ni, Co, Al, W, WN, any non-gold based metal or any combination thereof. For example, the gate metal (CMOS compatible metal) layer may be formed from TaN or TiN deposited after gate dielectric deposition 110 using a physical vapor deposition (PVD) process.

To form the gate structure, known gate lithography techniques 114, gate metal etch 116 and post etch clean 118 may be utilized. Hence, the gate first method may further comprise the steps of patterning a photo-resist 114 layer on the CMOS compatible metal layer, etching the photo-resist layer to form a CMOS compatible metal gate structure 116, and stripping any residual photo-resist after etching 118. The gate stack/structure formed using high-K gate dielectrics and metal gate formation on III-nitride is capable of being a CMOS compatible process. The metal gate etch process ended landing on high-K gate dielectric. This forms part of the self aligning method as the gate, structure is formed automatically with a single lithography procedure.

The method may further comprise the step 120 of depositing a thin spacer layer via any known spacer deposition methods, such as chemical vapor deposition or any other known deposition methods. This may be followed by etching 122 the thin spacer layer to form a thin spacer on both sides of the compatible metal gate structure. A thin spacer may be formed via deposition and etching of the thin spacer to lead to the formation of the thin spacer located between the binary layer and the third epitaxial layer. The thin spacer layer may be formed from $Al_2O_3$, $SiO_2$, $Si_3N_4$, any other suitable insulating materials or their combination thereof. Dry etching this thin spacer layer may form a sidewall (see structure 216 in FIG. 2) lining the gate structure. Advantageously, this side wall gate spacer created by the dry-etch process 122 prevents short circuits between the first and second contact areas (S/D), which may comprise Si, Ge or SiGe, and the gate.

There may also be the step 124 of etching the dielectric layer, the second and third epitaxial layers to expose the channel layer and to form a gate structure in the dielectric layer, the second and third epitaxial layers. Such a step may be known as the thin spacer over-etching step 124. This serves to allow subsequent Si, Ge or SiGe to be deposited over the epitaxial layers adjacent to both sides of the gate structure.

After over-etching, the method may comprise the step 126 of depositing a metal layer having a group 14 element selected from Si, Ge and their combination thereof, at 400° C. to 1200° C. (or 400° C. to 850° C., 400° C. to 800° C., 650° C. to 850° C. or any other temperature falling within these ranges) to cover the gate structure formed from the compatible metal layer, the dielectric layer, the second and third epitaxial layers. This metal layer may serve as the intermediate platform while using selected metal layering that could lower the contact resistance as salicidation/germanidation scheme is not possible directly on GaN/AlGaN materials, which, on the other hand, is possible with typical Si-technology. Accordingly, this method may be treated as a self align device fabrication process by deposition of Si, Ge or SiGe after metal gate and thin spacer layer formation either using a low or high temperature process.

The deposition of the metal layer comprising Si, Ge or their combination thereof may occur at 400° C. to 800° C.

The method may further comprise the steps of depositing 128 a thick spacer layer and etching 130 the thick spacer layer to form a thick spacer on both sides of the gate structure formed from the compatible metal layer, the dielectric layer, the second and third epitaxial layers for forming the gate electrode. This thick spacers wall deposited on top of Si, Ge or SiGe, may be required for electrical isolation of the Si, Ge or SiGe metal layer from the S/D and gate during salicidation/germanidation-type process. In this way, the thick spacer prevents electrical shorts between the binary and epitaxial layers and the gate electrode when the earlier is being annealed. These thick spacer layer/walls may be formed from $Al_2O_3$, SiON, $SiO_2$, $Si_3N_4$ or any other suitable insulating materials. At this stage, rapid thermal annealing may be carried out to cause the Si, Ge or SiGe to diffuse into the surface of first epitaxial layer, to enhance the first and second contact areas. Rapid thermal annealing may also be carried before a CMOS compatible metal is deposited on top of the exposed Si, Ge or SiGe after the thick spacer has been etched to form the thick spacer walls. The temperature range for annealing Si, Ge and SiGe may be, but not limited to, in a range of about 400° C. to about 1200° C. A typical process for contact may be performed at, a temperature of up to about 900° C. As such, a typical-temperature range for annealing may be in the range of about 400° C. to about 850° C. The thick spacer etch 130 also serves to open up the Si, Ge or SiGe for silicidation/germanidation.

Subsequently, the CMOS compatible metal selected from the group of Ta, TaN, Ti, TiN, Ni, Co, Al, W, WN, any non-gold based metal and their combination thereof, may be deposited 132 on the metal layer having a group 14 element selected from Si, Ge and their combination thereof, to form the binary layer. The binary layer may be annealed 134 at this stage with the first epitaxial layer to form the first and second contact areas with the gate electrode disposed between the first and second contact areas on the first epitaxial layer. The CMOS compatible metal layer may also be formed from alloys or a combination of materials such as, but not limited to, Ti/TiN, Ti/TaN, Ti/Al/Ni/W, Co/Ni/Ti/TiN, Ni/Ti or any other non-gold based combinations. The deposition of this CMOS compatible metal layer may lead to a self align silicided/germanided S/D contact process. Optionally, rapid thermal annealing may be carried out at this stage to fuse or activate the CMOs compatible metal layer, the metal layer comprising Si, Ge or SiGe and the surface of the first epitaxial layer possibly comprising GaN (see structure 222 of FIG. 2) This may serve to lower the contact resistance of the first and second contact areas (S/D).

Subsequently, any unreacted metal may be etched 136 or the wafer backside may be etched to reduce device thickness. Thereafter, steps 138 to steps 152 serves to form up the remaining structure of the device to ensure that the fabricated device is suitable for use. These steps may involve any suitable or standard processes known in the industry or available in foundries. The device is then subjected to electrical testing 154. Steps 138 to 152 may include standard CMOS process steps used in device foundries for completing device fabrication.

Figure 3:
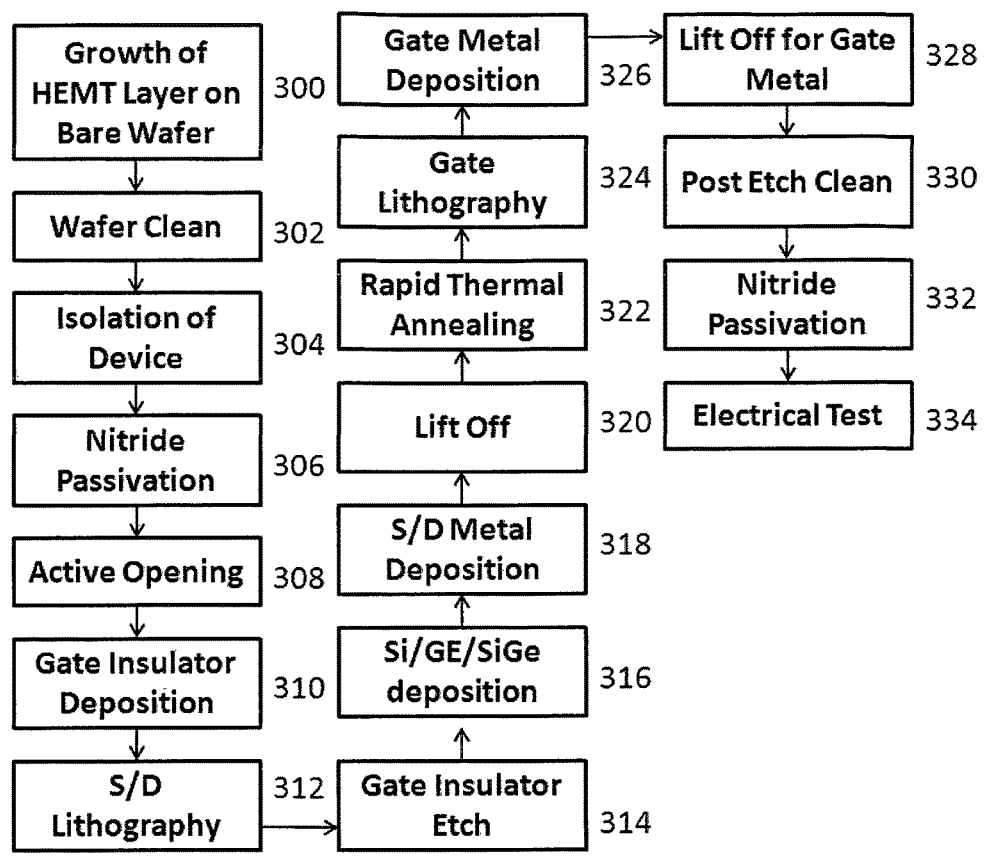
FIG. 3 shows a process flow diagram for the gate last process based on one of the embodiments disclosed herein.
Figure 4:
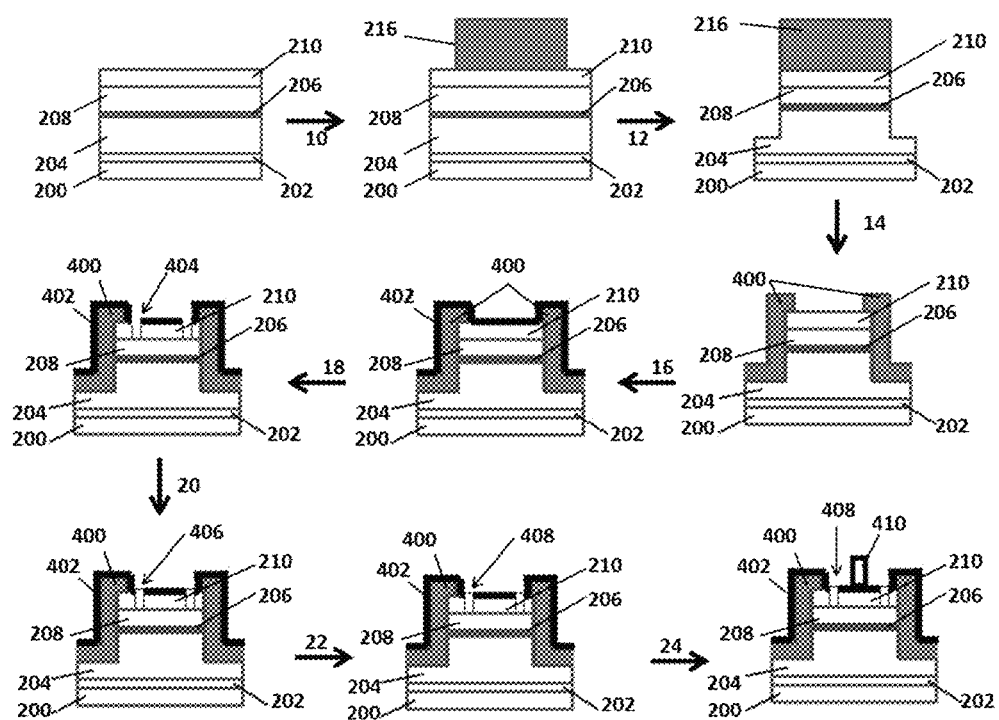
FIG. 4 shows a process scheme for the gate last process based on one of the embodiments disclosed herein.

Based on the same principles and similar to the above, the present method may be used for a gate last process (see FIG. 3 and FIG. 4). In such a method as depicted in FIG. 3, similar steps 300 to 306 as depicted in the gate first process may be utilized for forming the underlying basic device (e.g. HEMT) structure. Optionally, there may be an active opening procedure. This active opening may be an active area where the critical structure so the device are constructed. Without the active opening, a device may not be constructed as field nitride or oxide may tend to cover the entire top surface of the wafer. Optionally, a photo-resist may be patterned on the third epitaxial layer and etching the photo-resist, the first, second and third epitaxial layers to form an island (see structure 216 of FIG. 4) may be carried out. The photo-resist may be stripped and a field insulating layer surrounding the island may be deposited by any known means. Optionally, the photo-resist may not be stripped in a lift-off process scheme. This field insulating layer may comprise silicon nitride ($Si_3N_4$), silicon oxide ($SiO_2$), silicon-oxynitride (SiON) or $Al_2O_3$. Due to possible issues caused by downstream etching, it may be better to have a nitride/oxide combined layer. Subsequently, a gate insulating layer may be deposited 310. This gate insulating layer may be a dielectric layer. This gate insulating layer may comprise any material selected from $Al_2O_3$, $HfO_2$, $ZrO_2$, $TiO_2$, $Ta_2O_5$, Ta-doped $Al_2O_3$, HfAlO, $La_2O_3$, $Si_3N_4$, SiON, $Y_2O_3$, $HfSiO_4$, $SrTiO_2$, $LaAlO_3$, $SiO_2$ and their combination thereof.

Thereafter, the method may comprise the steps of patterning 312 a photo-resist and optionally etching 314 the photo-resist, optionally etching the gate insulator layer, optionally etching the field insulating layer, optionally etching the third and/or second epitaxial layer on the island to optionally form at least two troughs/recesses for the first and second contact on the island (see structure 404 of FIG. 4). Based on the above, it is possible that only the gate insulator may be etched so that no recesses are formed in the epitaxial layers. This may be known as a non-recess etch scheme. It is also possible that after etching the gate insulator layer on the island, further partial etching of the second and/or third epitaxial layer may be carried out so as to form at least two troughs/recesses. This may be known as a recess etch scheme. A metal layer having a group 14 element selected from Si, Ge and their combination thereof, may then be deposited 318 at a temperature in the range of about 273 K to about 350 K, at about 300 K or at room temperature, over the exposed second and/or third epitaxial layer or deposited 318 at a temperature in the range of 273 K to about 350 K, at about 300K, or at room temperature to cover the at least two troughs/recesses on the island, depending on which etch scheme is used and whether a lift-off process is used. If a lift-off process is used, the deposition of this group 14 metal layer may occur at a temperature in the range of 273 K to about 350 K, at about 300 K, or at room temperature via any known deposition means, such as but not limited to, PVD or CVD. It should be noted that other methods of deposition may be used if a higher temperature is required for the deposition.

The Si, Ge or SiGe elemental semiconductors may be used as the n type dopants for III-V semiconductors and thus used as n+ dopants at S/D for a 2DEG heterostructure device. The device may be subjected to further lift off 320. A lift-off process may include the following steps: (a) UV sensitive photo-resist coating by spin coating method (b) UV exposure through the photo-mask, (c) development of a patterned photo-resist in a developer solution (in such a process, the resist may be removed from locations where. Si, Ge, SiGe or any other metals that need to be deposited) (d) Si, Ge or SiGe or any other metal deposition by PVD, CVD or other evaporation technique, (d) dipping (soaking) in acetone or any other suitable chemical solution to remove the resist. There may be a need for further ultra-sonic treatment to clear any residual chemicals or resists. By executing processes (a) to (d), the Si, Ge, SiGe or any other suitable metals may be present only in the area as explained in step (c) and the rest of the substrate surface may be cleared of any undesired materials.

At this stage, the Si, Ge or SiGe metal layer may be optionally subjected to rapid thermal annealing 322 to cause this metal layer to diffuse into the surface of the second and/or third epitaxial layers in the troughs/recesses. It should be noted that the RTA condition may vary from 400° C. to 1200° C.

A CMOS compatible metal selected from the group of Ta, TaN, Ti, TiN, Ni, Co, Al, W, WN, any non-gold based metal and their combination thereof, may be deposited 326 on the metal layer having a group 14 element selected from Si, Ge and their combination thereof, to form the binary layer in the at least two troughs/recesses if the second and/or third epitaxial layers have been partially etched, or over the exposed second and/or third epitaxial layers if only the gate insulator has been etched. The gate electrode may be formed on the island between the first and second contact areas after this binary layer is annealed with the second and/or third epitaxial layer to form the first and second contact areas (S/D). The CMOS compatible metal layer may also be formed from alloys or a combination of materials such as, but not limited to, Ti/TiN, Ti/TaN, Ti/Al/Ni/W, Co/Ni/Ti/TiN, Ni/Ti or any other non-gold based metal combination. The deposition of this CMOS compatible metal layer may lead to a self align silicided/germanided S/D contact process. A gate lithography 324 may be included to assist with the metal deposition.

Optionally, subsequent lifting off 328, post etch cleaning 330 and nitride passivation 332 may be included to finish the remaining built of the device. These processes may involve any known suitable processes. This device may then be subjected to an electrical test 334.

It should be noted that the method for the gate last process offers to control the breakdown voltage power devices of such GaN on silicon, SOI, sapphire or SiC substrate HEMTs.

Regardless of a gate first or gate last process, it should be noted that the Si, Ge or SiGe are the n-type dopant for the GaN layers. For steps without recess etch, the dopant may advantageously diffuse into the GaN cap layer and distribute within AlGaN layer. For partial recess etch of the AlGaN layer, the Si, Ge or SiGe may diffuse into both the GaN and AlGaN layer. The activated dopant may be retained in the AlGaN layer. It is also possible that both the AlGaN and GaN layers may be activated.

In the method defined above, the annealing of the binary layer with the first, second or third epitaxial layer to form the first and second contact areas may occur at 400° C. to 1200° C. In the case of Si, a higher range of temperature may be needed to form a better silicide contact at the S/D as compared to Ge or SiGe. This higher temperature range may hinder the electrical performance of the gate metal structure as the thermal stability of gate matters a lot for breakdown, switching and leakage parameters.

When a thin layer of Ge or SiGe is used instead of Si, this allows the lower temperature range to be used for germanidation, diffusion of Ge or SiGe into the top epitaxial layer, and subsequent doping to form n+ GaN for better ohmic contacts. Ge or SiGe may also be a better n-type dopant in GaN systems compared to Si. Notably, these materials may be used for recess or non-recess etching technologies used to form the S/D.

Based on the above methods (also see FIG. 2 and FIG. 4), there may be provided a semiconductor device having a structure comprising:

a first and a second nucleation layer 202 disposed on a substrate 200;

a binary layer comprising a group 14 element selected from Si, Ge and their combination thereof disposed over the first and second nucleation layers 202; and a first contact area and a second contact area disposed over the substrate, wherein the first and second contacts areas formed from annealing the binary layer with the first, second or third epitaxial layer are capable of providing a lower contact resistance for a current to flow in the device.

The structure may further comprise, before the binary layer is deposited:

a first epitaxial layer 204 and a second epitaxial layer 208 disposed on the first and second nucleation layers 202 to form a channel layer 206 comprising portions of the first and second epitaxial layers;

a third epitaxial layer 210 disposed on the second epitaxial layer 208; and wherein the binary layer is disposed over the first, second and/or third epitaxial layers, and wherein the first and second contact areas formed from annealing the binary layer with the first, second or third epitaxial layer, are disposed on the first epitaxial layer 204, or disposed on the third epitaxial layer 210, or partially embedded in the second and/or third epitaxial layers. As mentioned above, the annealing may involve any of the epitaxial layers.

A gate electrode may be disposed between the first and second contact areas before or after the binary layer is annealed with the first, second or third epitaxial layer.

In this structure, the first and second nucleation layers may be formed from an aluminum nitride layer. This second nucleation layer may have a thickness of 200 nm to 400 nm. The first or second nucleation layer may also have a thickness between 0.5 nm to 450 nm, 0.5 nm to 3.0 nm, 200 to 450 nm or any thicknesses falling within these ranges. This second nucleation layer may also be disposed over of any of the epitaxial layers. The thickness of the AlN nucleation layer 202 may vary depending on whether a 200 mm or a 150 mm diameter substrate is used.

The first epitaxial layer 204 may be GaN layer with a thickness of 1.5 um to 3.0 um. The GaN layer may have a thickness of substantially 2.5 um.

The second epitaxial layer 208 may be an AlGaN layer with a thickness of 15 nm to 25 nm. This AlGaN layer may have a thickness of substantially 20 nm. The aluminum content of this layer may be 20 to 25 wt %. The aluminum content may also be 22 to 23 wt %. This second epitaxial layer 208 may serve as the a barrier layer.

The third epitaxial layer 210 may be formed from GaN having a thickness of 1.5 nm to 3.5 nm, 2.0 nm to 3.0 nm or any thicknesses falling within these ranges.

As explained above, a channel layer 206 comprising a two dimension electron gas (2DEG) layer 206 may be formed due to the difference in the band gap between the first and second epitaxial layers. It may also be possible that the 2DEG heterostructure is taken to comprise a gallium buffer layer, the first and second nucleation layer comprising aluminum nitride, a second epitaxial AlGaN layer, and a top gallium nitride layer.

It may also be possible that the above structure comprises an aluminum nitride nucleation layer followed by a thicker Gallium nitride layer disposed on a substrate, followed by a thin AlN spacer layer, AlGaN barrier layer, and a thin binary GaN cap layer.

It may also be possible that the binary layer comprises a group III-V material (GaN), a thin spacer group III-V material (AlN), a ternary barrier layer (AlGaN), a group III-V thin binary layer (GaN) and a group element selected from Si, Ge and their combination thereof.

Accordingly, it may also be possible for the structure to be constructed by starting with a substrate, or particularly a Si substrate, with at least one AlN layer and the first epitaxial GaN layer may be grown as a buffer layer. Then a thin 1 nm to 3 nm AlN ultrathin spacer layer may be grown, then a AlGaN barrier layer of 20 nm may be grown and then a thin GaN cap which may be about 1 nm to 3 nm thick may be grown. The Si, Ge or SiGe layer may then be deposited over, these structures, which may then be subjected to alloying with the metal contacts that may be laid on top.

Figure 2:
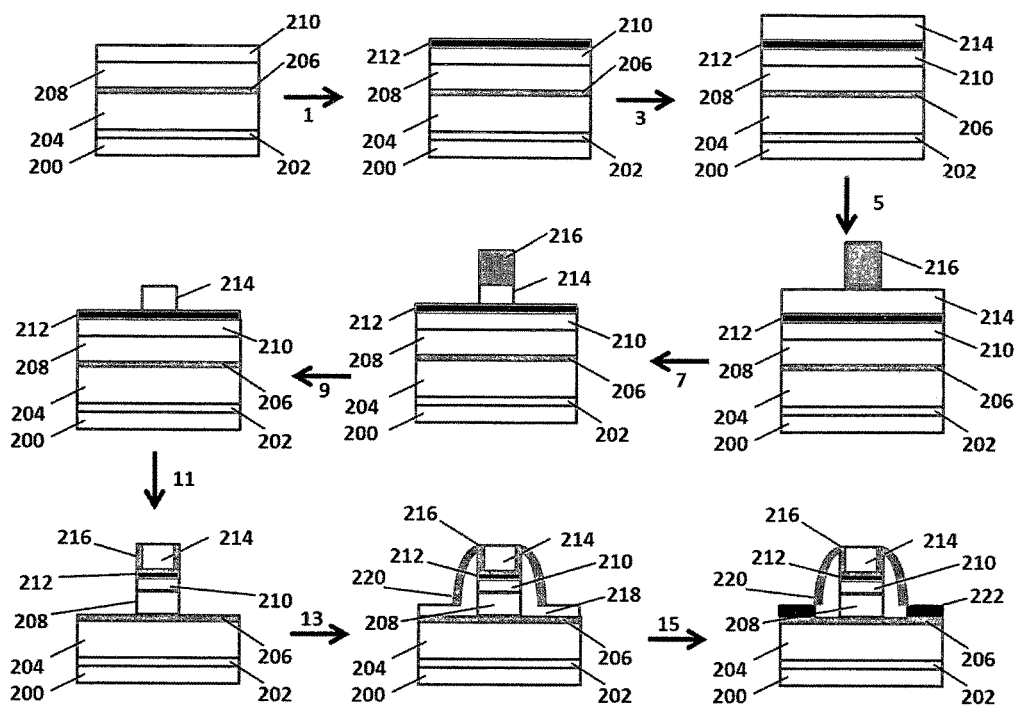
FIG. 2 shows a process scheme for the gate first process based on one of the embodiments disclosed herein.

The structure may further comprise shallow isolated trenches, mesa isolated trenches or deposited oxide layers (not shown in FIG. 2 and FIG. 4).

Based on the above method described for the gate first process and referring to FIG. 2, the gate electrode may have a structure comprising the second epitaxial layer 208, the third epitaxial layer 210, a dielectric layer 212 selected from aluminum oxide, hafnium oxide, and their combination thereof(other high-K gate dielectrics such as hfO$_2$, ZrO$_2$, TiO$_2$, Ta$_2$O$_5$, Ta-doped Al$_2$O$_3$, HfAlO, La$_2$O$_3$, Si$_3$N$_4$, SiON, Y$_2$O$_3$, HfSiO$_4$, SrTiO$_2$, LaAlO$_3$, SiO$_2$ or their combination thereof), and a CMOS compatible metal 214 selected from the group of Ta, TaN, Ti, TiN, Ni, Co, Al, W, WN, any non-gold based metal and their combination thereof. The CMOS compatible metal layer may also be formed from alloys or a combination of materials such as, but not limited to, Ti/TiN, Ti/TaN, Ti/Al/Ni/W, Co/Ni/Ti/TiN, Ni/Ti or any other non-gold based metal combination. The deposition of this CMOS compatible metal layer 214 may lead to a self align silicided/germanided S/D contact process.

As can be seen from arrow 1 in FIG. 2, a dielectric layer 212 is deposited on the third epitaxial layer 210. The CMOS compatible metal layer 214 is deposited subsequently via arrow 3 of FIG. 2. The above described layers may be deposited any known means as discussed in the above methods. The structure is then patterned 5 and etched (as illustrated by arrows 7 and 9 in FIG. 2) to form a preliminary gate structure.

Two thin spacer structures 216 may be created 11 on both sides of the gate electrode, wherein the two thin spacer structures 216 are disposed on the dielectric layer 212. The method for creating these two thin spacer side walls 216 have been described in the method above. An over-etch may be included as discussed above to form the gate structure after step 11.

After over-etching, subsequent steps 13 may be as follow.

A metal layer 218 having a group 14 element selected from Si, Ge and their combination thereof may be deposited to cover the gate structure formed from the compatible metal layer 214, the dielectric layer 212, the second 208 and third epitaxial 210 layers. This metal layer 218 may serve as the intermediate platform while using selected metal layering that could lower the contact resistance as salicidation/germanidation scheme may not possible directly on GaN/AlGaN materials which is possible in typical Si-technology. Accordingly, this structure may be treated as being formed from a self align device fabrication process by deposition of Si, Ge or SiGe after metal gate and thin spacer layer formation either using a low or high temperature process.

Step 13 may result in the structure having two thick spacer side walls 220, which may be formed from known deposition means as described above. The thick spacer layer may be etched to form a thick spacer 220 on both sides of the gate structure formed from the compatible metal layer 214, the dielectric layer 212, the second 208 and third epitaxial 210 layers for forming the gate electrode. Hence, the structure further comprises two thick spacer structures 220 on both sides of the gate electrode, wherein the two thick spacer structures 220 are disposed on the first epitaxial layer 204 and/or the channel layer 206. The thick spacer etch also serves to open up the Si, Ge or SiGe for silicidation/germanidation This thick spacers wall 220 deposited on top of Si, Ge or SiGe, may be required for electrical isolation of the Si, Ge or SiGe metal layer from the S/D and gate during salicidation/germanidation-type process. This thick spacer layer/walls 220 may be formed from Al$_2$O$_3$, SiO$_2$, Si$_3$N$_4$, SiON or any other suitable insulating materials. The two thick spacers may have a width of 50 nm to 10 um, 50 nm to 150 nm, or a width, of 100 nm to 200 nm. The two thick spacers may have a width of substantially 10 um.

At this stage, rapid thermal annealing may be carried out to cause the Si, Ge or SiGe to diffuse into the surface of first epitaxial layer 204, to enhance the first and, second contact areas.

Rapid thermal annealing (RTA) may also be carried before a CMOS compatible metal is deposited on top of the exposed Si, Ge or SiGe after the thick spacer has been etched to form the thick spacer walls 220. The RTA temperature may be in the range of 400° C. to 1200° C. The RTA temperature used may be 900° C. in GaN devices.

After forming the thick spacers walls 220, a CMOS compatible metal selected from the group of Ta, TaN, Ti, TiN, Ni, Co, Al, W, WN, any non-gold based metal or any combination thereof, may be deposited on the metal layer 218 having a group 14 element selected from Si, Ge or their combination thereof, to form the binary layer. The binary layer may be annealed at this stage (see arrow 15 of FIG. 2) with the first epitaxial layer to form the first and second contact areas 222 with the gate electrode disposed between the first and second contact areas on the first epitaxial layer. The CMOS compatible metal layer may also be formed from alloys or a combination of materials such as, but not limited to, Ti/TiN, Ti/TaN, Ti/Al/Ni/W, Co/Ni/Ti/TiN, Ni/Ti or any non-gold based metal combination. The deposition of this CMOS compatible metal layer may lead to a self align silicided/germanided S/D contact process. Optionally, rapid thermal annealing may be carried out at this stage to fuse or activate the CMOs compatible metal layer, the metal layer comprising Si, Ge or SiGe and the surface of the third epitaxial layer possible comprising GaN (see structure 222 of FIG. 2) This may serve to lower the contact resistance of the first and second contact areas 222 (S/D).

It should be noted that the two thin 216 and two thick spacers 220 may be made up of aluminum oxide, silicon nitride, silicon oxynitride, silicon dioxide or their combination thereof.

As depicted in FIG. 2, the first and the second contact areas 222 are formed from annealing the first epitaxial layer 204, the binary layer (not shown in FIG. 2) comprising a group, 14 element selected from Si, Ge or their combination thereof, and a CMOS compatible metal selected from the group of Ta, TaN, Ti, TiN, Ni, Co, Al, W, WN, any non-gold based metal or any combination thereof.

Based on the above method described for the gate first process and referring to FIG. 4, the gate electrode 410 may comprise a single CMOS compatible metal selected from the group of Ta, TaN, Ti, TiN, Ni, Co, Al, W, WN, any non-gold based metal or any combination thereof, when the first and second contact areas 408 are partially embedded in the second 208 and third epitaxial 210 layers. It is also possible that the first and second contact areas are disposed over the second and/or third epitaxial layer. The gate electrode may be formed on the island. In FIG. 4, the island is formed by patterning 10 a photo-resist and etching 12 the photo-resist, the first 204, second 208 and third epitaxial layers 210.

The structure may further comprise a field insulating layer 400 disposed 14 on an island formed from the first 204, second 208 and third epitaxial 210 layers in which the first and second contact areas 408 are partially embedded in the second and third epitaxial layers, and a gate insulating layer 402 disposed 16 on the field insulating layer 400. The field insulator layer may be a silicon nitride, silicon-oxynitride, Al$_2$O$_3$ or silicon oxide layer, and the gate insulating layer may be a gate dielectric layer selected from Al$_2$O$_3$, HeO$_2$, ZrO$_2$, TiO$_2$, Ta$_2$O$_5$, Ta-doped Al$_2$O$_3$, HfAlO, La$_2$O$_3$, Si$_3$N$_4$, SiON, Y$_2$O$_3$, HfSiO$_4$, SrTiO$_2$, LaAlO$_3$, SiO$_2$ and their combination thereof.

As shown in the final structure of FIG. 4, the first and second contact areas 408 partially embedded in the second 208 and third epitaxial 210 layers may be made up of an annealed layer comprising the second epitaxial layer 208, the third epitaxial layer 210, and the binary layer comprising a group 14 element selected from Si, Ge or their combination thereof, and a CMOS compatible metal selected from the group of Ta, TaN, Ti, TiN, Ni, Co, Al, W, WN, any non-gold based metal or any combination thereof. It may also possible that the first and second contact areas are not partially embedded in the second and/or third epitaxial layer, and are disposed over, the second and/or third epitaxial layer instead. Alternatively the first and second contact areas may be disposed on the third epitaxial layer if non-recess etch is utilized.

The deposition of the various layers has been described in the gate last method as discussed above.

In gate first and gate last structures described above, the height of the gate electrode may be 100 nm to 300 nm or within 150 nm to 250 nm.

The substrate referred to in this disclosure may be any suitable substrate such as, but not limited to a sapphire substrate, silicon substrate, silicon on insulator substrate or silicon carbide substrate.

The methods and structures described above may be applied for semiconductor device selected from a group consisting of field effect transistors, high electron mobility transistors, metal insulator semiconductor, inverters, power switches, power transistor devices, radio switches and radio-frequency based devices. It should be noted that these methods or structures may be applied for forming a transistor.

A GaN-based HEMTs produced by the above methods or having the above structures may be compatible with CMOS technologies for forming S/D, and the gate electrode. The HEMT underlying based structure may have systems selected from GaN/Al GaN/AlN/GaN, InAlN/AlN/GaN or InAlGaN/AlN/GaN. As with any HEMT device, there may be a 2DEG heterostructure formed within any of the layers as long as there is a sufficiently wide band gap. Accordingly, the above method may be treated as a self aligned CMOS contact process using Si, Ge or alloyed SiGe intermediate salicidation schemes.

It is also possible that there may be self aligned recess etch of S/D landing at the 2DEG layer after thin spacer etch. This may help to lower S/D contact resistance in HEMT on the substrate.

The process schemes or structures as described above advantageously reduces S/D contact resistance due to the deposition of Si, Ge or SiGe which may become a n-type dopant for thin cap GaN/AlGaN layers via the diffusion of such elemental semiconductors at appropriate annealing temperatures so as to improve electrical properties. The deposited Si, Ge, or SiGe may act like n+ implants in the epitaxial layers after salicidation/germanidation activation at the S/D area, wherein the Si, Ge or SiGe may be deposited by any known deposition process like supporting or electron beam evaporation, or by chemical vapor deposition techniques. The thickness of the various epitaxial layers may be varied so as to adjust the rate of diffusion of the Si, Ge or SiGe metal layer into the epitaxial. This may also affect the rate of the salicidation or germanidation process.

It should be further noted that the HEMT stack as defined above may comprise layers of Ti/TiN, Ni/Ti/TiN, Co/Ti/TiN, Ni/Ti/Al/W for the formation of ohmic and schottky contacts.

Advantageously, the present methods and structures serves provides a means for integrating CMOS compatible process technologies on GaN/AlGaN HEMT structure. They also allow the self align silicide/germanide (salicidation/germanidation) for GaN/AlGaN to be applied by using intermediate elemental semiconductors like Si, Ge, or SiGe with contact metal schemes to reduce the contact resistance to match or even surpass Au-based contact performances.

Advantageously, the present methods and structures allows an implantation step at the S/D for high voltage n-type device integration to be by-passed.

Advantageously, the silicide/germanide process temperature may be tuned to allow the Si, Ge or SiGe at the GaN/AlGaN interface to segregate for addressing enhance-mode type device layouts.

For the purpose of logic, both halo and lightly doped drain (LDD) may be integrated into the above methods. After the formation of the gate and thin spacer, an angle implant for LDD and halo may be incorporated with different dose. By tuning the epitaxial layer doping, it becomes possible to form different types of transistors using the present methods.

Figure 9:
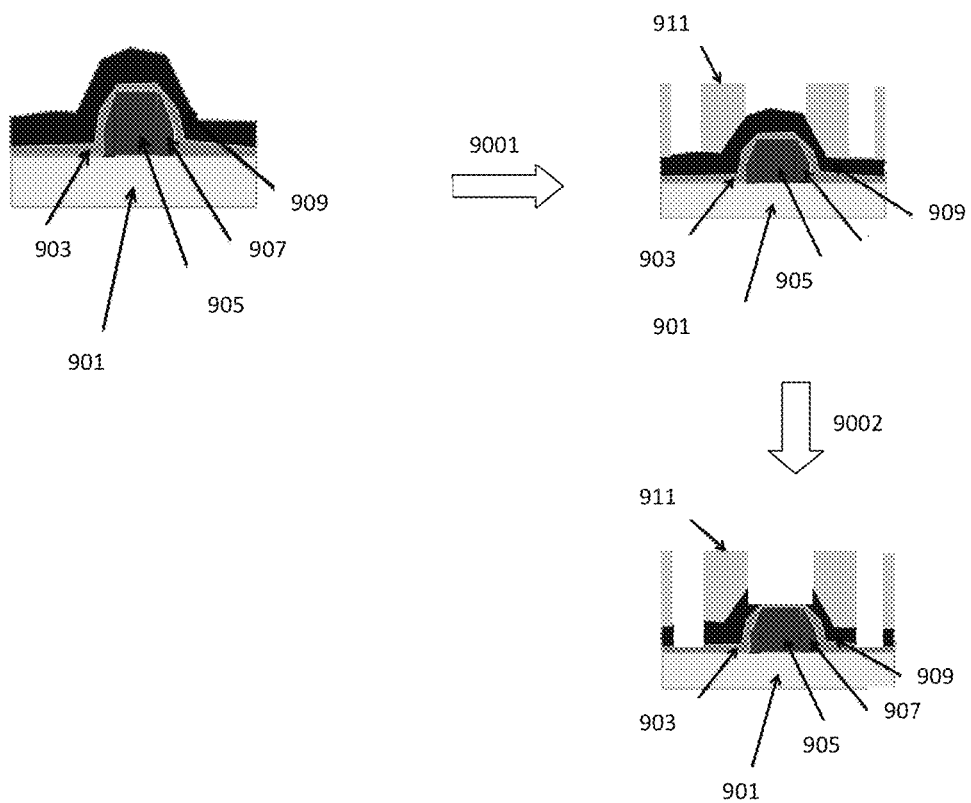
FIG. 9 shows a masking and etching fabrication scheme of a high powered device.

For high power devices, the spacer thickness may vary up to 10 um. In such cases, the thick spacer thickness may be implemented by adopting using one additional mask 911 and spacer dielectrics etching processing 9002 as shown in FIG. 9.

Generally, the thicknesses of the $Si_3N_4/SiO_2$ layers affect the spacer thickness (which may also be called a spacer width) after spacer etching. This thickness may be applicable for RF type and moderate high voltage devices.

Figure 7:
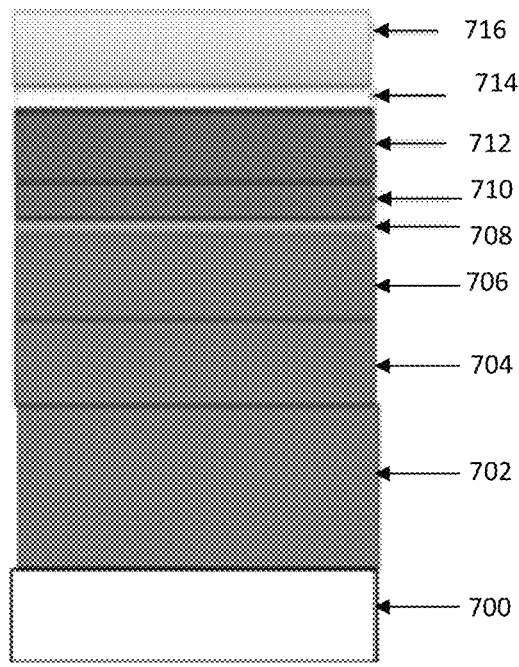
FIG. 7 shows a structural stack (not drawn to scale) for an AlGaN/GaN HEMT wafer.

Based on the above principles, a general device stack structure may be illustrated using FIG. 7 (not drawn to scale), the device may be constructed by first depositing a 3.4 um GaN layer 702 on a substrate 700 comprising AlN layers. Subsequently, a 20 nm AlGaN layer 704 and another 2 nm GaN layer 706 may be deposited over the first 3.4 um thick GaN layer 702. Thereafter, a 10 nm Ge layer 708, a 20 nm Ti layer 710, a 120 nm Al layer 712, a 20 nm Ni layer 714 and a 50 nm W layer 716 may be deposited. Other device stack structure may be constructed based on the method or structure as disclosed above.

As for high powered devices, it is to be noted that the spacer thickness may vary up to 10 um. In such devices, the thick spacer thickness may be implemented by the sub-process scheme as shown in FIG. 9 where one additional masking may be adopted along with a spacer dielectric etching. This sub-process scheme may be suitably adapted into either of the gate first or gate last method as described above.

In FIG. 9, the basic gate structure 905, the thin spacer walls 907 and the thick spacer layer 909, the Si, Ge or SiGe metal layer 903 and a HEMT structure 901 comprising GaN/AlGaN on a suitable substrate may be formed by the method as described above. Subsequently, masking 9001 of the thick spacer layer 909 may be applied so as to produced a partially exposed photo-resist layer 911 on the thick spacer layer 909. Thereafter, etching 9002 of the exposed thick spacer layer 909 may be carried out. By doing so, the existence of a thicker spacer wall helps to improve gate isolation and lower the risk of electrical shorts between the gate and the S/D for high powered devices.

It will be apparent that various other modifications and adaptations of the invention will be apparent to the person skilled in the art after reading the foregoing disclosure without departing from the spirit and scope of the invention and it is intended that all such modifications and adaptations come within the scope of the appended claims.

EXAMPLES

Non-limiting examples of the invention and comparative examples will be further described in greater detail by reference to specific examples, which should not be construed as in any way limiting the scope of the invention.

The experimental results relating to the present concept of CMOS compatible device processing for III-V nitride on Si/SOI substrates are shown below.

HEMT Structure Fabrication

The AlGaN/GaN HEMT epilayers were grown by a metal organic chemical vapor deposition process. The epitaxy was performed either on 200 mm diameter bulk Si substrate or on 150 mm bulk Si/SOI substrate. A thin low-temperature AlN nucleation layer was first grown followed by a thicker high-temperature AlN layer. The thickness of the AlN layers varied depending on whether a 200 mm or a 150 mm diameter substrate is used. The substrate thickness for Si/SOI substrates for 200 mm wafer is about 0.75 mm to 1.2 mm. For 150 mm diameter substrate, the substrate thickness is 600 um to 1000 um. AlGaN buffer layers of varying Al contents were overgrown on the second high-temperature AlN nucleation layer which is grown over the first AlN nucleation layer, followed by the growth of 2.5 µm thick GaN layer. The final HEMT active layers comprises of 1.0 nm to 1.5 nm ultrathin AlN spacer layer, about 20 nm $Al_xGa_{1-x}N$ barrier (Al content: 22 to 23 wt %), with a 1.5 nm to 3 nm thin GaN cap.

Series of samples grown on such 200 mm diameter or 150 mm diameter substrates demonstrated 2DEG characteristics which were confirmed by Hall effect measurements. The average sheet resistance from different samples varies in the range of 350 to 450 ohm/sq, with an average sheet carrier concentration of $9.0 \times 10^{12}$, $cm^{-2}$ to $1.1 \times 10^{13}$ $cm^{-2}$ in various samples. The HEMT structures were then subjected to device fabrication steps as described below.

Device Isolation

Shallow trench isolation, known mesa isolation or deposited field oxide processes may be used for isolating the device. The mesa isolations are defined by active area patterns and inductively coupled plasma (ICP) or reactive ion etching (RIE) using $Cl_2/BCl_3$ chemistry.

Subsequently, two approaches for fabricating CMOS-compatible self align process for AlGaN/GaN HEMTs have been utilized in these examples although it is understood that other approaches utilizing the same principles as taught herein may be possible. The contact schemes employed in these examples are capable of being subjected to a wide range of temperature for annealing depending on the type of metal stacks selected. Other considerations may also include the required thickness of dielectric passivation and deposition conditions of various metal layers.

Fabrication Method for Gate First Process

The method for gate first process is depicted in FIG. 1 and FIG. 2. After device isolation (device isolation may include mesa etching and nitride/oxide deposition to cause the device isolation to be similar to one isolated with STI. It may also be any known deposited filled oxide scheme), the gate stack comprising 7 nm $Al_2O_3$ was deposited at 300° C. by atomic layer deposition (ALD) using alternating pulses of $Al(CH_3)_3$ and $H_2O$ as the precursors. CMOS compatible metal TaN or TiN was deposited after gate dielectric, deposition using a physical vapor deposition (PVD) process. The thickness of the metal gate can vary between about 150 nm to 250 nm. The gate pattern was defined by optical lithography followed by standard metal etch process. Thin spacer layers comprising $Al_2O_3/SiO_2$, $Si_3N_4$ or their combination thereof, were deposited using a low pressure CVD process (LPCVD). The low pressure CVD may be applicable for depositing spacers made from $Al_2O_3/SiO_2$, $Si_3N_4$ or their combination. Other deposition processes may also include ALD, LPCVD, PECVD or PVD. After the thin spacer etch, an over etch process was performed to clear the third GaN epitaxial cap layer and the second AlGaN epitaxial layer. Si, Ge or SiGe was deposited at varying temperature 400° C. to 800° C.

A thick spacer comprising $Al_2O_3/SiO_2$, $Si_3N_4$ or their combination thereof, was deposited using LPCVD process and rapid thermal annealing was carried out for Si, Ge or SiGe activation/diffusion into the third epitaxial GaN layer at the 2DEG area.

Depending on the applications, $HfO_2$, $Al_2O_3$ or their combination thereof, can also be used for the dielectric layers. After activation, spacer etching was carried out using reactive ion etching (RIE) which offers etching capabilities that is selective to the underlying ultrathin Si, Ge or SiGe layer. Silicon compatible silicide metal Ti/TiN deposition, silicidation and unreacted metal etch done for this self align process.

The above process steps may be suitably altered with various deposition and annealing conditions.

Fabrication Method for Gate Last Process

After device isolation the S/D lithography was followed by deposition of Si, Ge or SiGe and a CMOS compatible metal (e.g. Ti/TiN, Ni/Ti/TiN, Ni/Ti/Al/W) stack using electron beam evaporation and customized sputtering techniques. The rapid thermal annealing (RTA) of the S/D metal for ohmic contact and dopant segregation after the liftoff process.

For the case of MISHEMT process, the gate last options are highlighted below.

First process step was the active island formation followed by gate insulator deposition. In next step, the S/D litho, gate insulator etching, Ge, Si or SiGe followed by CMOS metal stack deposition for S/D, lift off, and RTA to form ohmic first and second contact areas (S/D). After S/D formation, further lithography step may be necessary for gate formation by gate metal (Ni/W, Ni/Ti/W, Ni/Ti/Al/W) deposition. The process flow and the schematic device architecture built are shown in FIG. 3 and FIG. 4.

MISHEMT and MOSHEMT Fabrication

The above examples relate to CMOS compatible self align intermediate layers silicided/germanided on GaN/AlGaN layers, which are grown on either 200 mm or 150 mm diameter SOI, Si, sapphire, or SiC substrates. However, these methods as described in the above examples are not limited to GaN/AlGaN HEMT system. These methods are also applicable for producing III-V MISHEMT fabrication and could also be applicable to InAlN/AlN/GaN or InAlGaN/GaN active layer systems. Accordingly, MISHEMT fabricated devices are also known as metal insulator semiconductor HEMT. In this instance, the insulator is a gate insulator. Generally, gate insulators are gate dielectrics selected from such as $Al_2O_3$, $HfO_2$, $ZrO_2$, $TiO_2$, $Ta_2O_5$, Ta-doped $Al_2O_3$, HfAlO, $La_2O_3$, $Si_3N_4$, SiON, $Y_2O_3$, $HfSiO_4$, $SrTiO_2$, $LaAlO_3$, $SiO_2$ and their combination thereof.

In metal oxide semiconductor HEMT (MOSHEMT), a photo mask was designed and taped out for MOSHEMT fabrication. GaN/AlGaN on Si, SOI substrates was used to fabricate devices. The fabrication process is a multistep process which includes, cleaning of the III-V semiconductors, gate dielectric deposition, gate lithography, gate metal deposition, gate metal etch (or by lift off process).

Likewise, thin spacer layer deposition and etching may be included, followed by mild recess etch of S/D to land near the 2DEG layer. Si, Ge or SiGe deposition and annealing are also needed. The temperatures used for deposition and annealing of the Si, Ge or SiGe, depend on the material that is used.

Electrical Characterization

Figure 5:
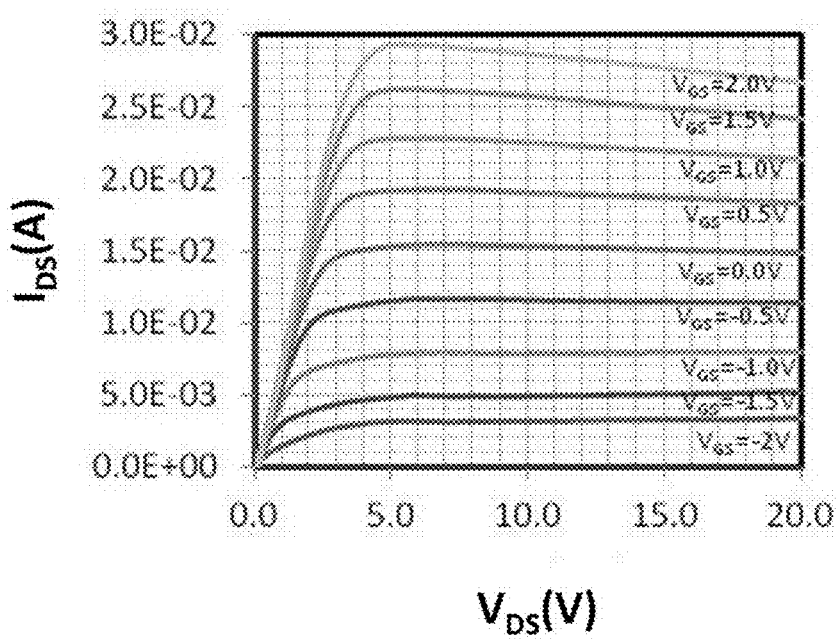
FIG. 5 shows the $I_{DS}$ plotted against the $V_{DS}$ for a HEMT device comprising Ge in its annealed binary layer at various $V_{GS}$.
Figure 6:
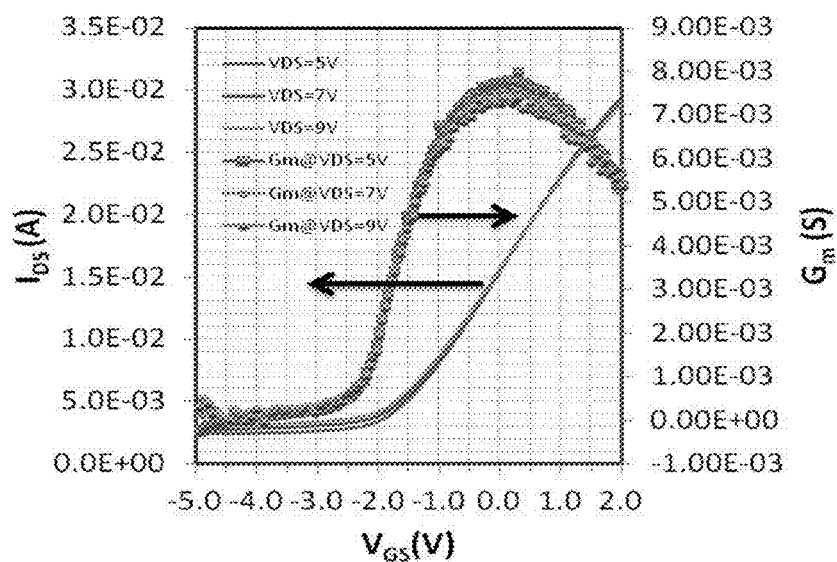
FIG. 6 shows the $I_{DS}$ and transconductance ($G_m$) plotted against the $V_{GS}$ for a HEMT device comprising Ge in its annealed binary layer at various $V_{DS}$.

FIG. 5 shows the typical device characteristics using a gate last process. The dC characteristics are illustrated to showcase transistor prototypes. Although comparable results were obtained with using standard Au-based process steps, these results highlight the applicability of the present method regarding the CMOS compatible process schemes. The CMOS compatible process step includes the use of Ge diffusion steps in S/D with a follow up on transistor characteristics. The $I_{DS}$-$V_{DS}$ and $I_{DS}$-$V_{GS}$ and transconductance ($g_m$) characteristics of the fabricated HEMT devices are shown in FIG. 6.

Depth Profiling and Structural Analysis of Ge/Si and the Diffusion Characteristics A device was fabricated and the contact processing results were characterized. To further understand the contact processes and the chemistry of metal reaction on nitride surface, experiments have been carried out via depth profiling and structural analysis of the Si/Ge, particularly regarding the diffusion of Ge/Si.

In this study, Ge has been chosen for the analysis with following type of stack shown in FIG. 7 on a 200 mm diameter AlGaN/GaN HEMT wafer. The schematic of the metal stack for source/drain is shown in FIG. 7. The substrate labeled as 700 comprises AlN on silicon. Subsequently, 3.4 um of GaN labeled as 702, 20 nm of AlGaN labeled as 704, 2 nm of GaN labeled as 706 are deposited over the AlN layer. The various metals layers labeled as 708 to 716 comprising Ge, Ti, Al, Ni and W, respectively, are then formed over the HEMT base structure. TEM and EDX analysis are further performed to check the cross section of the metal stack and composition.

Figure 8:
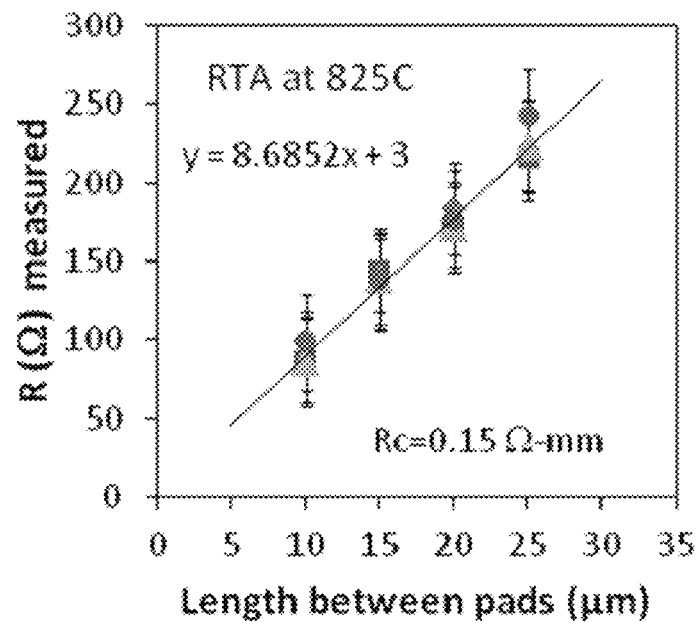
FIG. 8 shows the contact resistance results of the present device.

Experimental results showed that Ge diffuses until 50 nm depth at GaN/AlGaN and is also present in the Ni. In the Ni, it is the Ge rich Ni germanide which causes some agglomeration. To avoid oxygen, it is necessary to perform annealing in a vacuum environment. However, due to tool limitations, vacuum RTA was not available, and contact resistance up to a value similar to Au-based contact processing on such HEMTs are demonstrated. These results are shown in table 1 below and FIG. 8. Table 1 lists the contact resistance of various HEMT using conventional gold-based and non-gold based structures that are not the same as the above methods or structures disclosed. Comparing the contact resistance of the present device as shown in FIG. 8, the present device obtained by the present method exhibited a lower contact resistance. Notably, all conventional gold-based technologies as indicated in table 1 had rough contact surfaces. Meanwhile, the contact surfaces developed using conventional non-gold-based technologies by MIT and Temasek/NTU had smooth surfaces.

At present, commercial foundry device (HEMT, LED etc.) makers using GaN on Si may not be readily available in the market. Till now, non-Au based HEMTs may not readily available in the market.

TABLE 1

Contact resistance values for different GaN HEMT structured devices on silicon substrate using conventional III-V gold based technologies and conventional CMOS-compatible non-gold-based ohmnic stacks.

| Technology Category | Entities | HEMT Structure On Si | Metal Stack | Annealing Temperature (° C.) | Contact Resistance, $R_c$ (Ω mm) |
|---|---|---|---|---|---|
| Conventional Gold-Based | Nitronex | AlGaN/GaN | Ti/Al/Ni/Au | 825 | 0.45 |
| | NTU | | | 825 | 0.18 |
| | ETH-Z | | | 850 | 0.45 |
| | IEMN | | | 900 | 0.5 |
| Conventional Non-Gold Based | IMEC | AlGaN/GaN/AlGaN | Ti/Al/W | 800 | 0.65 |
| | IMEC | AlGaN/GaN/AlGaN | Ti/Al/Ti/TiN (recess based scheme) | 550 | 1.25 |
| | MIT | AlGaN/GaN | Ti/Al/W (recess based scheme) | 870 | 0.49 |
| | Temasek/NTU | AlGaN/GaN | Ta/Si/Ti/Al/Ni/Ta | 800 | 0.24 |

The invention claimed is:

1. A semiconductor device having a structure comprising:
   a first nucleation layer and a second nucleation layer disposed on a substrate;
   a first epitaxial layer and a second epitaxial layer disposed over the first and second nucleation layers to form a channel layer comprising portions of the first and second epitaxial layers;
   a third epitaxial layer disposed on the second epitaxial layer;
   a binary layer comprising a group 14 element selected from Si, Ge and their combination thereof disposed over the first and second nucleation layers;
   a thin spacer located between the binary layer and the third epitaxial layer; and
   a first contact area and a second contact area disposed over the substrate, wherein the first and second contacts areas formed from annealing the binary layer with the first, second or third epitaxial layer are capable of providing a lower contact resistance for a current to flow in the device.

2. The semiconductor device of claim 1,
   wherein the binary layer is disposed over the first, second and third epitaxial layers, and
   wherein the first and second contact areas formed from annealing the binary layer with the first, second or third epitaxial layer, are disposed on the first or third epitaxial layer or partially embedded in the second and/or third epitaxial layer, preferably further comprising a gate electrode disposed between the first and second contact areas before or after the binary layer is annealed with the first, second or third epitaxial layer, and preferably wherein the height of the gate electrode is 100 nm to 300 nm, and preferably wherein the first nucleation layer has a thickness in the range of 25 nm to 30 nm, and preferably wherein the second nucleation layer has a thickness in the range of 200 nm to 400 nm, and preferably wherein the first epitaxial layer is a gallium nitride layer with a thickness of 1.5 um to 3.0 um, and preferably wherein the second epitaxial layer is an aluminum gallium nitride layer with a thickness of 15 nm to 25 nm.

3. The semiconductor device of claim 2, wherein the second epitaxial layer has an aluminum content of 20 to 25 wt %, preferably wherein the second epitaxial layer has an aluminum content of 22 to 23 wt %.

4. The semiconductor device of claim 2, wherein the third epitaxial layer is a gallium nitride layer having a thickness of 1.5 nm to 3.5 nm, preferably wherein the gallium nitride layer has a thickness of 1.5 nm to 3.0 nm.

5. The semiconductor device of claim 2, wherein the channel layer is a two dimension electron gas (2DEG) layer, optionally wherein the structure further comprises shallow isolated trenches, mesa isolated trenches or deposited oxide layers.

6. The semiconductor device of claim 2, wherein the gate electrode has a structure comprising the second epitaxial layer, the third epitaxial layer, a dielectric layer comprising aluminum oxide, hafnium oxide, or their combination thereof, and a CMOS compatible metal selected from the group of Ta, TaN, Ti, TiN, Ni, Co, Al, W, WN, any non-gold based metal and their combination thereof, preferably wherein the first and the second contact areas are formed from annealing the first epitaxial layer, the binary layer comprising a group 14 element selected from Si, Ge and their combination thereof, and a CMOS compatible metal selected from the group of Ta, TaN, Ti, TiN, Ni, Co, Al, W, WN, any non-gold based metal and their combination thereof.

7. The semiconductor device of claim 6, wherein the gate electrode further comprises two thin spacer structures on both sides of the gate electrode, wherein the two thin spacer structures are disposed on the dielectric layer, preferably wherein the gate electrode further comprises two thick spacer structures on both sides of the gate electrode, wherein the two thick spacer structures are disposed on the first epitaxial layer, and preferably wherein the two thin and two thick spacers are made up of aluminum oxide, silicon nitride, silicon dioxide or their combination thereof, and preferably wherein the two thick spacers have a width of 50 nm to 10 μm.

8. The semiconductor device of claim 2, wherein the gate electrode comprises a single CMOS compatible metal selected from the group of Ta, TaN, Ti, TiN, Ni, Co, Al, W, WN, any non-gold based metal and their combination thereof, when the first and second contact areas are disposed over the third epitaxial layer or partially embedded in the second and/or third epitaxial layer, preferably wherein the structure further comprises a field insulator layer disposed on an island formed from the first, second and third epitaxial layers in which the first and second contact areas are disposed over the third epitaxial layer or partially embedded in the second and/or third epitaxial layers, and a gate insulating layer disposed on the field insulator layer, and preferably wherein the field insulator layer is a silicon nitride, silicon oxide, silicon-oxynitride or $Al_2O_3$ layer, and the gate insulating layer is gate dielectric layer selected from $Al_2O_3$, $HfO_2$, $ZrO_2$, $TiO_2$, $Ta_2O_5$, Ta-doped $Al_2O_3$, HfAlO, $La_2O_3$, $Si_3N_4$, SiON, $Y_2O_3$, $HfSiO_4$, $SrTiO_2$, $LaAlO_3$, $SiO_2$ and their combination thereof, and preferably wherein the first and second contact areas disposed over the third epitaxial layer or partially embedded in the second and/or third epitaxial layer are made up of an annealed layer comprising the second and/or the third epitaxial layer, and the binary layer comprising a group 14 element selected from Si, Ge and their combination thereof, and a CMOS compatible metal selected from the group of Ta, TaN, Ti, TiN, Ni, Co, Al, W, WN, any non-gold based metal and their combination thereof.

9. The semiconductor device of claim 2, wherein the height of the gate electrode is 100 nm to 300 nm, and optionally wherein the substrate is a sapphire substrate, a silicon substrate, a silicon on insulator substrate or a silicon carbide substrate.

10. A transistor having the structure of claim 1.

* * * * *